United States Patent [19]

Smith

[11] Patent Number: 5,051,609

[45] Date of Patent: Sep. 24, 1991

[54] SIMPLIFIED DRIVER CIRCUIT FOR SOLID-STATE POWER SWITCHES

[75] Inventor: Gerald L. Smith, Torrance, Calif.

[73] Assignee: Teledyne Inet, Torrance, Calif.

[21] Appl. No.: 591,681

[22] Filed: Oct. 2, 1990

[51] Int. Cl.$^5$ .............................................. H03K 3/01
[52] U.S. Cl. .................................... 307/270; 307/254; 307/261
[58] Field of Search ................ 307/254, 261, 262, 270

[56] References Cited

U.S. PATENT DOCUMENTS

| | | | |
|---|---|---|---|
| 3,652,876 | 3/1972 | Baum et al. | 307/262 |
| 3,818,253 | 6/1974 | Chafer et al. | 307/254 |
| 3,932,766 | 1/1976 | Kudeljan et al. | 307/254 |
| 4,034,236 | 7/1977 | Aveneau et al. | 307/261 |
| 4,075,511 | 2/1978 | Lewis | 307/254 |
| 4,236,089 | 11/1980 | Baker | 307/254 |
| 4,716,304 | 12/1987 | Fiebig et al. | 307/254 |

Primary Examiner—Stanley D. Miller
Assistant Examiner—Terry D. Cunningham
Attorney, Agent, or Firm—Monty Koslover

[57] ABSTRACT

A simplified driver circuit for solid-state switches, comprising a main drive circuit and an adaptor circuit. The main drive circuit is powered only by the normal switch control signal input and by an external, regulated power supply commonly used by the equipment controls. No individual power supplies are used for the driver. The main circuit incorporates precise circuits for shaping and directing the input control signals, exceptionally high voltage isolation to avoid transmission of harmful noise and a circuit for delivering the required gate drive to a field-effect-transistor switch. The adaptor circuit connects to the output terminals of the main circuit, and modifies the drive signal to that required for a bi-polar transistor or a silicon controlled rectifier.

The invention circuit is characterized by its use of few precise components, its high noise isolation and low power dissipation.

8 Claims, 4 Drawing Sheets

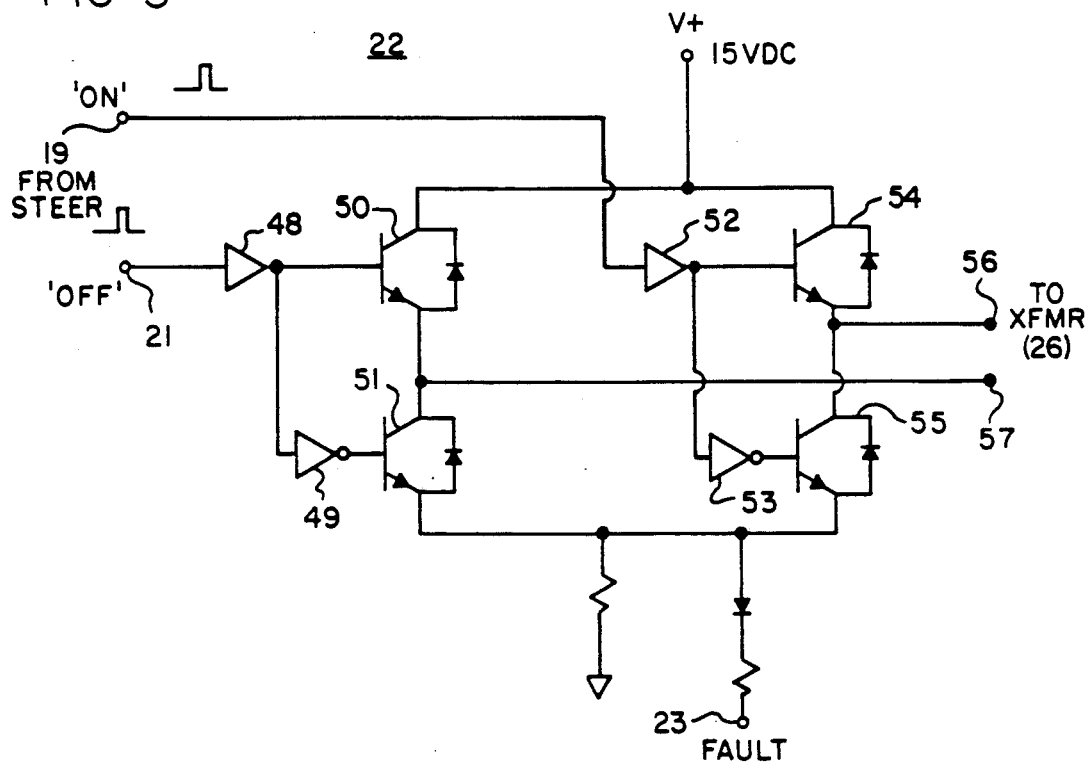
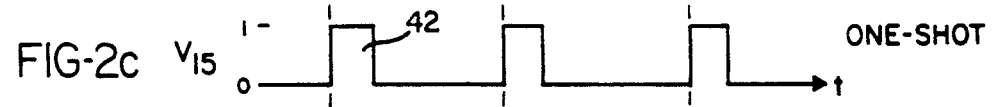
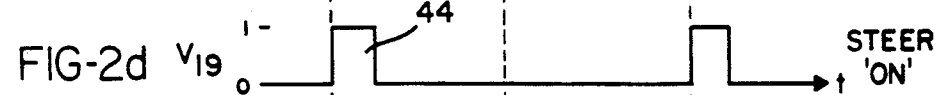

SIMPLIFIED DRIVER CIRCUIT FOR SOLID-STATE POWER SWITCHES

BACKGROUND OF THE INVENTION

1. Field of the Invention

The invention relates to circuits used to turn on and off solid-state power switches by applying drive signals to their gates, and more particularly to a novel approach for simplifying the driver circuit.

2. Prior Art Drive Circuitry

Present day driver circuits for solid-state switches such as bi-polar transistors and SCR's, utilize a separate power supply to supply drive power to the gate. If the power supply is external to the driver, it will generally be operated at relatively high voltage and the current will be transmitted at high frequency in order to keep transformer size to a minimum. Depending on the size of the power switch to be driven and the switching rate, the supply current may be high, and the power supply has to be sized accordingly to meet its needs. The power supply and its switching circuits must be electrically isolated from the transistor gate and the signal source, because of possible high common mode voltages from the transistor which result in transmitted noise. In the best known driver circuit mechanizations, only about 1500 volts isolation is typically available, using isolating transformers. Noise transmission from the power transistor is often problematic, necessitating elaborate schemes for suppression of these disruptive signal elements. The resulting drive circuits, are therefore complex and expensive, typically costing hundreds of dollars each or even thousands where high reliability components are used as in military applications. In a typical 3-phase power converter, as many as twelve or twentyfour driver boards may be used, costing thousands of dollars. Thus, there exists a need for a simple driver circuit that does not need a separate power supply; that has high voltage isolation and is relatively inexpensive.

SUMMARY OF THE INVENTION

The invention comprises two circuits; a "main" circuit and an "adaptor" circuit. These are used in the following manner: the main circuit alone, becomes a gate driver for power field-effect-transistors (FET) or insulated-gate-bipolar transistors (IGBT); the adaptor circuit is added, connected to the main circuit to form a base driver for bi-polar power transistors and SCR's.

The main circuit portion of the driver makes use of the fact that in FET's the gate is capacitive and current in the FET is controlled by a voltage applied to the gate electrode. The driver is powered only by the normal switch control signal input and by an external, regulated DC power supply commonly used by the signal source. No individual power supplies are used.

The main portion of the driver circuit comprises circuit means to shape and direct the typical PWM switching signal input; a power switching bridge means, a small ferrite core transformer for isolation, a capacitor for storing the drive current energy, and circuit means for delivering the energy to the transistor gate. Little current is consumed; typically in the order of 10 to 20 ma current as compared to more than 100 ma for state-of-the-art drivers. The use of a torroid ferrite core transformer with few turns, produces voltage isolation in excess of 5,000 volts. This is practical because only pulsed amounts of power are transferred across the transformer, which has very small winding to winding capacitance and thick insulation.

The adaptor circuit utilizes a FET that is switched by the main signal output to apply steady gate current and voltage to the bases of either a bi-polar transistor or SCR as required.

When all possible components of the two invention circuits are considered, they add up to relatively few components as compared with state-of-the-art drivers.

Accordingly, it is a principal object of this invention to provide a driver circuit for solid state switches which does not incorporate separate power supplies, with their inherent bulk and thermal losses.

Another object is to provide a driver circuit that has high voltage isolation and low noise transmission.

A further object is to provide a driver circuit that can be used for SCR's, bi-polar transistors and FETs.

Yet another object is to provide a driver circuit which is composed of few components, resulting in increased reliability. An advantage accruing from the use of few components, is the relatively low cost per driver board.

Further objects and advantages of the invention will become apparent from the study of the following portion of the specification, the claims and the attached drawings.

BRIEF DESCRIPTION OF THE DRAWINGS

FIGS. 2a–2e are voltage waveforms at certain identified locations of the FIG. 1 block diagram;

FIG. 3 is a simplified schematic diagram of a power switching bridge circuit which can be used for the switching bridge means in the main portion switch driver circuit of the present invention;

DESCRIPTION OF THE PREFERRED EMBODIMENTS

Figure 1:
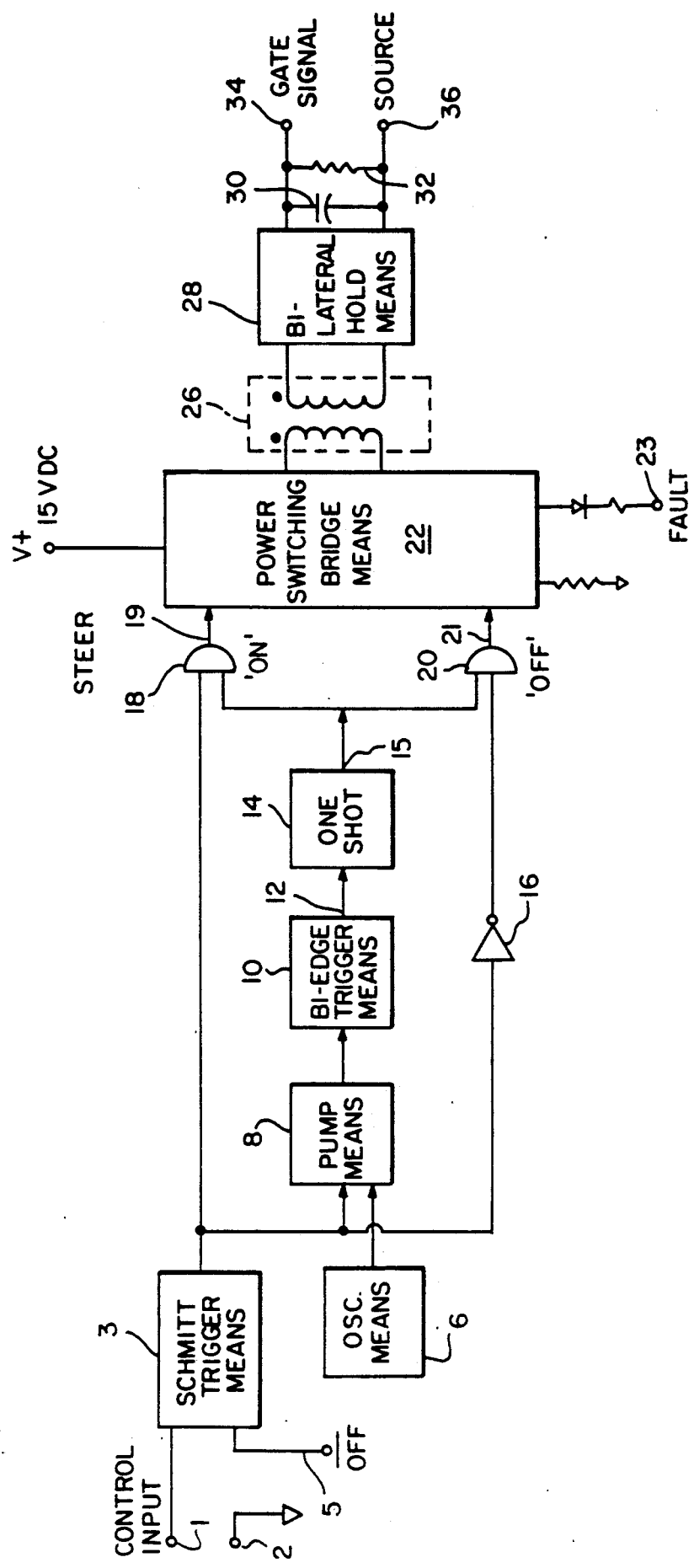
FIG. 1 is a block diagram of the main portion of the switch driver circuit, embodying the principles and method of the present invention, and capable of being used for driving field-effect-transistors directly.
Figure 2:
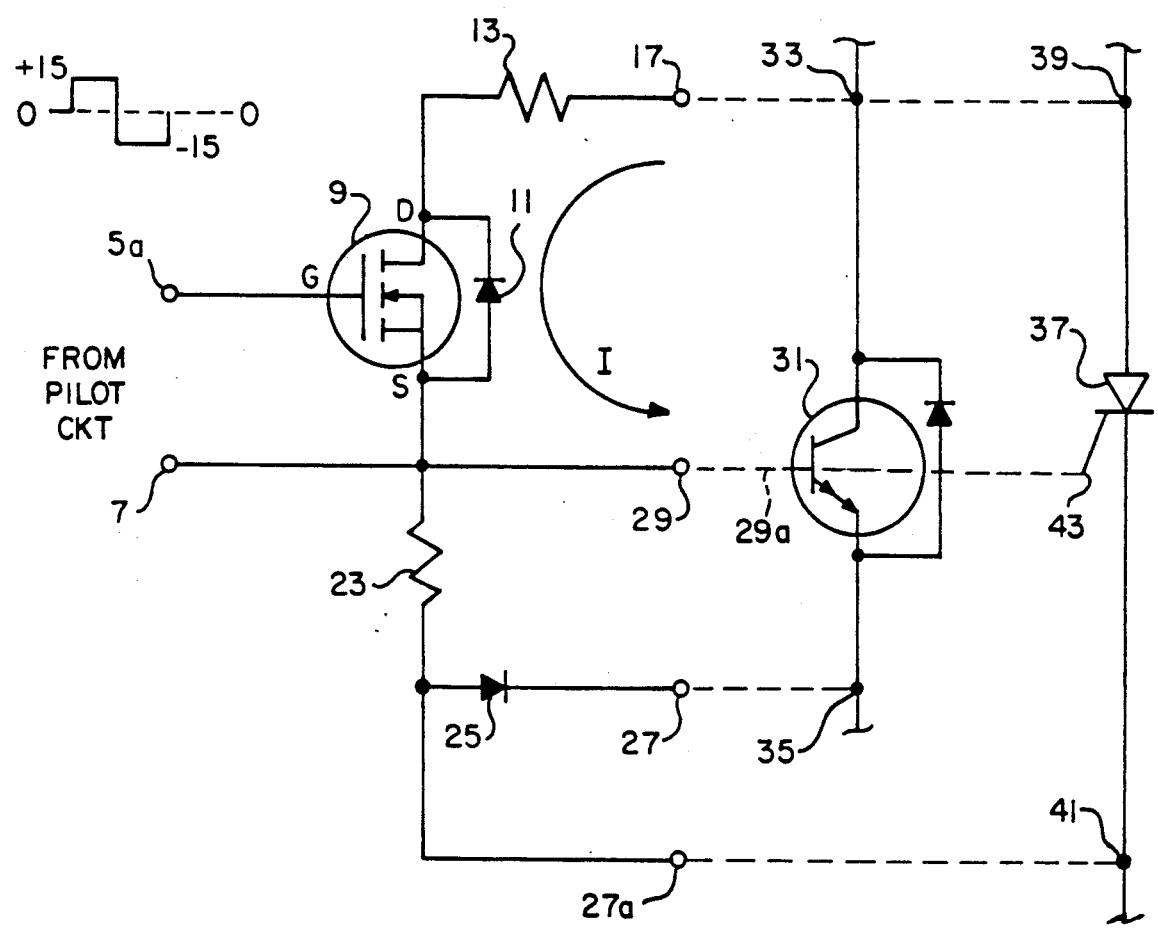
FIG. 2 is a simplified circuit diagram of the adaptor portion of the switch driver circuit, embodying the principles and method of the present invention, and intended for connection to the main portion so that it can be used for driving bi-polar type transistors or silicon controlled rectifiers (SCR's)

Referring to FIGS. 1 and 2, there is shown in FIG. 1 a block diagram of the main portion of the simplified driver circuit, illustrating the invention embodiment and method. FIG. 2 shows a circuit diagram of the adaptor portion of the driver circuit, showing also its indicated connections for driving a bi-polar transistor or an SCR.

The main portion of the driver circuit alone, is capable of driving field-effect-transistor (FET) type switches, and its output signal is tailored to fit the capacitive nature of the FET or IGBT gate. However, in order to drive the gates of either bi-polar transistors or SCR's it is necessary to modify the output signal of the main circuit. This is the function of the adaptor circuit which is illustrated in FIG. 2, and shown for connection to either a transistor or an SCR. The two portions of the switch driver circuit are now described:

Referring now to FIG. 1, the main circuit comprises a signal shaping circuit, a steering circuit, a power switching means, an electrical isolation transformer and an output circuit for delivering energy to a FET gate. From the left of FIG. 1, the control input signal is connected at input terminals 1 and 2 and input to a Schmitt trigger means 3. The signal shaping circuit comprises a Schmitt trigger means 3, an oscillator means 6, a pump means 8, a bi-edge trigger means 10, and a one-shot monostable vibrator 14. The steering circuit comprises an inverter 16 and two steering gates: first AND gate 18 and second AND gate 20 which produce 'ON' and 'OFF' steering signals. A power switching bridge means 22 accepts the 'ON' and 'OFF' signals from the steering circuit and outputs positive and negative pulses to an isolation transformer 26. An output circuit comprising a bi-lateral hold means 28, a capacitor 30 and resistance 32 takes the pulsed transformer 26 output, processes the signal and delivers it, gate to source of a connected FET at 34, 36. The gate signal is a $+/-15$ V square wave and a high current pulse. This is sufficient to turn on an FET.

Other inputs to the main circuit are an 'OFF' signal 5 into the Schmitt trigger means 3 to turn the circuit off, a +15 VDC input and a 'FAULT' signal 23 to the switching bridge means 22. The standard logic power +13 VDC (not shown) is applied as required to all logic components. The +15 VDC is taken from a regulated DC power supply and provides the voltage and current for the driver output.

The adaptor circuit shown in FIG. 2, comprises an N-channel power FET 9, a FET bypass diode 11, two resistors 13 and 23 and a second diode 25. Capacitors (not shown) may also be added. The circuit is connected to the output terminals 34, 36 of the main circuit shown in FIG. 1 when the gate driver is to be used to drive bi-polar transistors or SCR's. The main circuit output square wave of $+/-15$ V is applied to its input terminals 5a, 7 and connected to the gate of the power FET 9 and its source. Assume a connection is made to a bi-polar transistor 31 at its collector 33, emitter 35 and gate 29a. When the FET 9 is switched on by the incoming positive square wave, gate drive current 'I' flows from the transistor collector 33 through the first resistor 13, the FET 9 and to the transistor base 29a, turning the transistor 31 ON. The second resistor 23 applies termination while the second diode 25 acts to block reverse transistor turn-on due to parasitic or other currents.

If an SCR 37 is to be driven, the adaptor circuit is connected 17 to the anode 39; connected 29 to its gate 43 and connected 27a, bypassing the second diode 25, to the SCR cathode 41. The reverse current blocking protection of the second diode 25 is not needed for the SCR driving function, and therefore is not used in this application.

FIGS. 2a through 2e show the voltage signal waveforms at various points in the signal shaping circuit of the FIG. 1 main circuit. In FIG. 2a, V1 is the control input signal after being shaped by the Schmitt trigger means 3. The square wave 38 corresponds to the high and low thresholds of the input signal at 1 and 2.

Referring again to FIG. 1, the Schmitt trigger means 3 output signal is connected directly to a first AND gate 18 and through an inverter 16, to a second AND gate 20. A free-running oscillator means 6 provides a series of positive pulses to the pump means 8. The pump means 8 functions to ensure that there is always a positive signal pulse to the bi-edge trigger means 10. Normally, the positive output of the Schmitt trigger means 3 is available, so that the pump means 8 is inactive. However, at times of interrupted control input signal activity, the pump means 8 utilizes the oscillator means 6 signal to pass through a pulse for refreshing the output capacitor 30.

During normal switching and input signal activity, as shown in FIG. 2b, the bi-edge trigger means 10 outputs (V12) positive narrow pulses 40 at the leading and trailing edges of the V1 waveform 38. These pulses are fed into a one-shot monostable vibrator 14 which outputs (V15) wider pulses 42 corresponding to the bi-edge trigger pulses. The one-shot output 15, shown in FIG. 2c, is fed in parallel to the first and second AND gates 18,20 which act as steering for the power switching bridge means 22. As shown in FIGS. 2d and 2e, the steer 'ON' signals 44 at V19 are shifted with respect to the steer 'OFF' signals 46 at V21 by the time period between bi-edge trigger pulses.

Pump means 8 can be achieved by using an exclusive OR gate supplied by the oscillator means 6 and the Schmitt trigger means 3 outputs. This will ensure that the pump output is high when either input is high. The bi-edge trigger means 10 similarly, may use an exclusive OR gate together with an R-C network input to form the pulse. A "one-shot" 14 monostable vibrator is available in several IC packages. In this application, it is triggered on the rising edge of the bi-edge trigger pulse.

Figure 5:
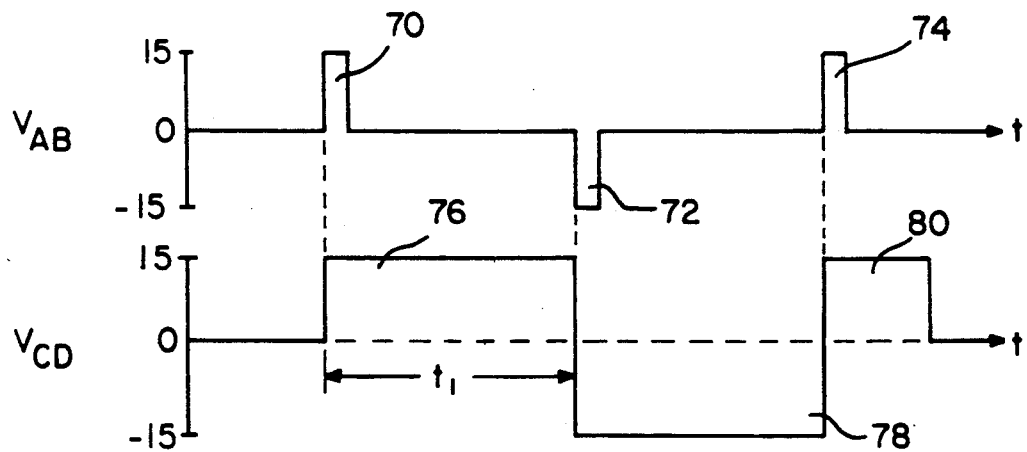
FIG. 5 illustrates the waveforms at the input and output of the bi-lateral hold means; and useful in understanding the function of the bi-lateral hold means.

Referring now to FIG. 3, there is shown a simplified schematic of a circuit which fulfills the functions of a power switching bridge means 22. Bipolar transistors 50, 51, 54 and 55 are depicted. These however may be replaced by P-Channel and N-Channel MOSFETS as needed. The first pair of transistors 54, 55 receive an 'ON' signal from the output 19 of the first AND gate 18. The second pair of transistors 50, 51 receive an 'OFF' signal from the output of second AND gate 19. By applications of these signals to the gates of the transistors, the transistors are made to switch on and off in a sequence that switches the +15 VDC bridge input positive and negative in nano-second width pulses. The FIG. 5 top waveform shows these pulses 70, 72, 74. The bridge 22 output is connected to the transformer 26 primary at terminals 56, 57. Diodes are provided across each of the transistors to limit the back swing voltage.

A means is provided for switching the main circuit off in the event of a fault being detected in the driven power circuit, necessitating controlled turn-off of the driven power transistor or SCR. A resistor and diode in series connection are connected in parallel with the normal resistance to ground of the bridge, forming a 'FAULT' terminal 23. An application of a 'FAULT' low signal at the terminal 23 softens the turn-off voltage in the bridge transistor switches, limiting the rate of change of current di/dt in the transistors by changing the resistance to current flow. The signal may also be applied at the same time to the Schmitt trigger means 3 input, to shut down the main circuit. The 'FAULT' signal originates at a "Close Field" detector, which is located on a bus bar or cable of the power switching circuit that is being switched. This "Close Field" detector is the subject of a companion patent application, and has the capability of detecting a fault condition much faster than the conventional Current Transformer detector circuits; a necessary requirement of present day, fast switching solid state switches.

Only pulsed amounts of power are transferred across the transformer 26, which is a torroid ferrite core transformer with a small number of turns, typically 15, having very small winding to winding capacitance. This configuration produces little coupled noise while achieving voltage isolation in excess of 5,000 volts.

Figure 4:
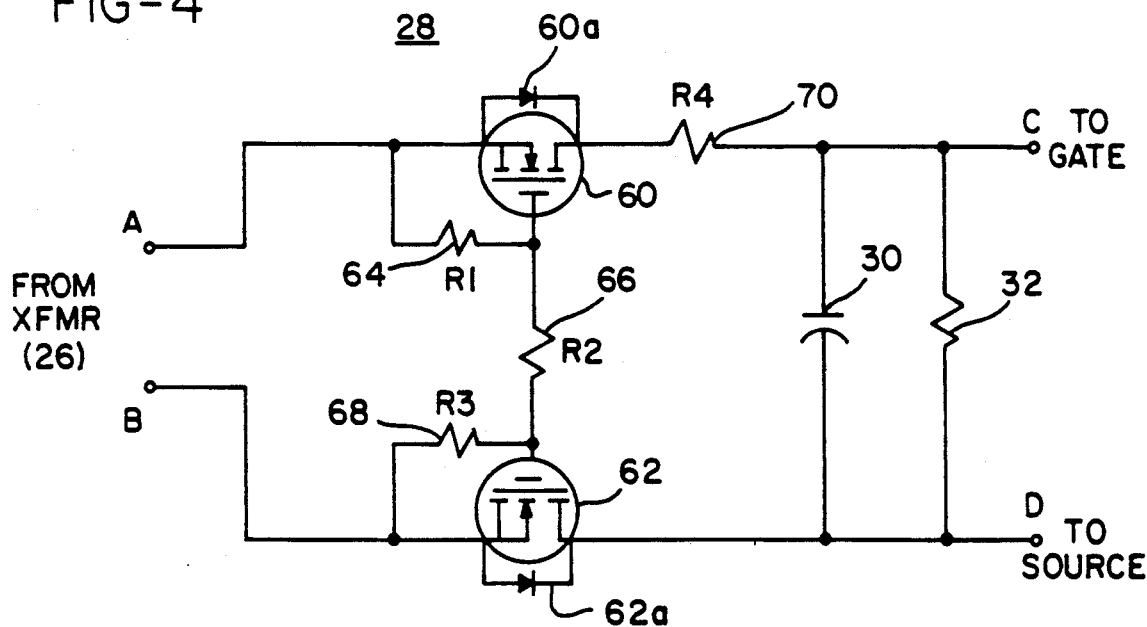
FIG. 4 is a simplified schematic diagram of the output circuit portion of the main circuit, particularly showing an embodiment of the bi-lateral hold means including the output capacitor and resistance.

FIG. 4 is a simplified schematic diagram of the main output circuit, particularly showing bi-lateral hold means 28, including the output capacitor 30 and resistance 32. In the bi-lateral hold circuit, first and second N-Channel MOSFETS 60 and 62 are utilized to extend the transformer 26 output voltage pulses until the polarity changes. The first MOSFET 60, which is connected source to drain in the driver Gate signal line, switches on when the +15 V voltage pulse 70 is received from the transformer 26. The capacitor 30 is charged to hold up the voltage. The effect is shown in the FIG. 5 voltage waveform VCD at 76, 78, and 80. Transformer voltage pulse 70 is extended for a period t1 as shown in the VCD waveform 76, corresponding to the time until voltage VAB changes polarity. The negative VAB voltage pulse 72 is similarly extended by operation of the second MOSFET 62. Bypass diodes 60a and 62a are connected across the MOSFETs, and together with ratioed resistors R1, R2, R3 and R4, act to eliminate back-swing voltage effects and provide a current path.

From the foregoing description, it is believed that the preferred embodiment achieves the objects of the present invention. Various modifications and changes may be made in the circuits described hereinabove which are apparent to those skilled in the art. All such modifications and changes are considered to be within the scope of the appended claims and are embraced thereby.

What is claimed is:

1. A driver circuit for driving the gates of solid-state power switches, including field-effect-transistors (FETs), bi-polar transistors and silicon-controlled-rectifiers (SCR's), comprising in combination:
   (a) a main circuit, comprising
      an input terminal connected to the output of a control signal source;
      a signal shaping circuit including a Schmitt trigger means receiving the signal at said input terminal, an oscillator means, a pump means, a bi-edge trigger means, and a one-shot monostable vibrator, all connected in series;
      a steering circuit including a first AND gate, an inverter and a second AND gate; said first AND gate having its inputs connected to said Schmitt trigger means output and to said one-shot output; said inverter and second AND gate being connected in series, inverter output to gate input; said inverter input being connected to said Schmitt trigger output; said second AND gate other input being connected to said one-shot output; said first AND gate producing an output 'ON' signal and said second AND gate producing an output 'OFF' signal;
      a power switching bridge means for producing switched voltage and current pulses; said switching bridge means input being connected to the outputs of said first and second AND gates; and
      an isolation transformer for providing high voltage isolation between said power switching bridge and an output circuit of said main circuit;
      an output circuit which is connected to the secondaries of said isolation transformer and comprising a bi-lateral hold means, a capacitor and resistor; said bi-lateral hold means for extending the width of the voltage pulses which are passed by said transformer;
      said main circuit accepting a control signal input from said control signal source to its input terminal and processing said control signal through said signal shaping circuit, through said steering circuit, through said power switching bridge means, through said isolation transformer, and through said output circuit, producing a gate-to-source signal capable of energizing the gate to source terminals of a field-effect-transistor or IGBT; and
   (b) an adaptor circuit for connection to output terminals of said main circuit, for the purpose of driving the gate of a bi-polar transistor; said adaptor circuit comprising:
      an N-channel field-effect transistor (FET);
      a first diode connected between a drain and source of said FET acting as a bypass for said FET;
      a first resistor connecting a drain of said FET to a collector of said bi-polar transistor, providing a bias voltage between the collector of said bi-polar transistor and a gate of said FET; and
      a second resistor and second diode in series connection, connecting a source of said FET to an emitter of said bi-polar transistor, providing a termination between the gate of said FET and the emitter of said bi-polar transistor and also reverse current blocking protection;
      said FET source also being connected to a base of said bi-polar transistor and to a source input terminal of said adaptor circuit; said FET gate being connected to a gate input terminal of said adaptor circuit; said adaptor circuit input terminals, when connected to the output of said main circuit, receiving a square wave voltage control signal and current pulses and applying said voltage signal and pulse across the gate and source of said FET, switching it ON; said FET ON state permitting current flow from the collector of said bi-polar transistor through said first resistor and said FET and into the base of said bi-polar transistor, switching it ON.

2. A driver circuit for driving the gates of solid-state power switches, including field-effect-transistors (FETs), bi-polar transistors and silicon-controlled-rectifiers (SCR's), comprising in combination:
   (a) a main circuit, comprising
      an input terminal connected to the output of a control signal source;
      a signal shaping circuit including a Schmitt trigger means receiving the signal at said input terminal, an oscillator means, a pump means, a bi-edge trigger means, and a one-shot monostable vibrator, all connected in series;
      a steering circuit including a first AND gate, an inverter and a second AND gate; said first AND gate having its inputs connected to said Schmitt trigger means output and to said one-shot output; said inverter and second AND gate being connected in series, inverter output to gate input; said inverter input being connected to said Schmitt trigger output; said second AND gate other input being connected to said one-shot output; said first AND gate producing an output 'ON' signal and said second AND gate producing an output 'OFF' signal;

a power switching bridge means for producing switched voltage and current pulses; said switching bridge means input being connected to the outputs of said first and second AND gates; and an isolation transformer for providing high voltage isolation between said power switching bridge and an output circuit of said main circuit;

said output circuit being connected to the secondaries of said isolation transformer and comprising a bi-lateral hold means, a capacitor and resistor; said bi-lateral hold means for extending the width of the voltage pulses which are passed by said transformer;

said main circuit accepting a control signal input from said control signal source to its input terminal and processing said control signal through said signal shaping circuit, through said steering circuit, through said power switching bridge means, through said isolation transformer, and through said output circuit, producing a gate-to-source signal capable of energizing the gate to source terminals of a field-effect-transistor or IGBT; and (b) an adapter circuit for connection to output terminals of said main circuit, for the purpose of driving the gate of a silicon-controlled-rectifier (SCR); said adapter circuit comprising:

an N-channel field effect transistor (FET);

a first diode connected between a drain and source of said FET acting as a bypass for said FET;

a first resistor connecting a drain of said FET to an anode of said SCR, providing a bias voltage between the anode of said SCR and a gate of said FET; and a second resistor connecting a source of said FET to a cathode of said SCR and providing a termination between the gate of said FET and the cathode of said SCR;

said FET source also being connected to a gate of said SCR and to a source input terminal of said adaptor circuit; said FET gate being connected to a gate input terminal of said adaptor circuit; said adaptor circuit input terminals, when connected to the output of said main circuit, receiving a square wave voltage control signal and current pulses and applying said voltage signal and pulse across the gate and source of said FET, switching it ON; said FET ON state permitting current flow from the anode of said SCR through said first resistor and said FET and into the gate of said SCR, switching it ON.

3. The driver circuit combination of claim 1 which further comprises fault means effective to switch the power switching bridge means off, and thereby also the main circuit off in the event of a fault being detected in the driven power circuit.

4. The fault means of claim 3 which includes a diode and resistor in series connection and connected between the power switching means and a fault input.

5. The main circuit of claim 1 wherein:
said bi-edge trigger means includes an exclusive OR gate and R-C network input to form positive pulses at the leading and trailing edges of the control signal input voltage waveform.

6. The main circuit of claim 1 wherein:
said power switching bridge means includes four bi-polar transistors arranged in two pairs; one pair connected to said first AND gate and responding to the 'ON' signal from the steering circuit and the other pair connected to said second AND gate responding to the 'OFF' signal from said steering circuit; said bi-polar transistors each having a diode connected across their collector to emitter paths to limit back swing voltage; said power switching bridge means input including +15 Vdc from an external regulated power supply and means for providing a 'FAULT' signal input; said means including a diode and resistor in series connection.

7. The main circuit of claim 1 wherein:
said isolation transformer is a torroid ferrite core, having a small number of turns, typically 15 turns and having a low winding to winding capacitance; said transformer passing little coupled noise and achieving voltage isolation in excess of 5,000 volts.

8. The main circuit of claim 1 wherein:
said output circuit comprises a bi-lateral hold means having a pair of input connected to the secondary of the isolation transformer, a capacitor and resistor, both connected in shunt with an output of said bi-lateral hold means;

said bi-lateral hold means including a first and a second N-Channel MOSFET, a bypass diode across a drain-source path of each MOSFET and four resistors; said first MOSFET, on receipt of a positive voltage pulse from said transformer and acting together with said capacitor, to store the positive voltage until its polarity changes; said second MOSFET, on receipt of a negative voltage pulse from said transformer and acting together with said capacitor to store the negative voltage until its polarity changes;

said output circuit providing a square wave output voltage signal having a current pulse to the driver Gate to Source terminals.

* * * * *